(12) United States Patent
Barnum et al.

(10) Patent No.: US 11,430,632 B2
(45) Date of Patent: Aug. 30, 2022

(54) METHOD AND SYSTEM FOR GENERATING RECIPROCAL SPACE MAP

(71) Applicant: FEI Company, Hillsboro, OR (US)

(72) Inventors: Andrew Barnum, Hillsboro, OR (US); Mark J. Williamson, Hillsboro, OR (US)

(73) Assignee: FEI Company, Hillsboro, OR (US)

( * ) Notice: Subject to any disclaimer, the term of this patent is extended or adjusted under 35 U.S.C. 154(b) by 0 days.

(21) Appl. No.: 17/116,210

(22) Filed: Dec. 9, 2020

(65) Prior Publication Data

US 2022/0181117 A1 Jun. 9, 2022

(51) Int. Cl.
| | | |
|---|---|---|
| *H01J 37/28* | (2006.01) | |
| *H01J 37/31* | (2006.01) | |
| *H01J 37/30* | (2006.01) | |
| *G06T 7/11* | (2017.01) | |
| *G06V 10/25* | (2022.01) | |
| *H01J 37/317* | (2006.01) | |

(52) U.S. Cl.
CPC .............. *H01J 37/28* (2013.01); *G06T 7/11* (2017.01); *G06V 10/25* (2022.01); *H01J 37/3005* (2013.01); *H01J 37/3174* (2013.01); *G06T 2207/10061* (2013.01)

(58) Field of Classification Search
CPC .... H01J 37/28; H01J 37/3005; H01J 37/3174; G06T 7/11; G06T 2207/10061; G06V 10/25

USPC .......................... 250/306, 307, 309, 310, 311
See application file for complete search history.

(56) References Cited

U.S. PATENT DOCUMENTS

| | | | |
|---|---|---|---|
| 5,576,543 A | 11/1996 | Dingley | |
| 2017/0168285 A1* | 6/2017 | Ozcan | G03H 1/0443 |
| 2021/0151287 A1* | 5/2021 | Hyde | H01J 37/28 |
| 2021/0199604 A1* | 7/2021 | Dravid | G06N 20/00 |

OTHER PUBLICATIONS

Rodriguez, Pedro et al., Effect of different crystal defects on bend contours and LACBED patterns, Jan. 2002.
M. Cabie et al, Geometrical criteria required for the determination of the epitaxial stress from the transmission electron microscopy curvature method, Applied Physics Letters 86, No. 19 (2005).
Mechanical Stress on the Nanoscale: Simulation, Material Systems and Characterization Techniques, Margrit Hanbeucken, Pierre Meuller, and Ralf B. Wehrspohn editors, Wiley-VCH Verlag GmbH & Co. KGaA, Nov. 2011, Chapter 9, Ponchet, Anne et al., Strain Analysis in Transmission Electron Microscopy: How Far Can We Go?, pp. 191-212.

* cited by examiner

*Primary Examiner* — Nicole M Ippolito

(57) ABSTRACT

Reciprocal space map of specific sample locations is generated based on the sample images acquired by irradiating the sample with a charged particle beam at multiple incident angles. The incident angles are obtained by tilting the charged particle beam and/or the sample around two perpendicular axes within the sample plane. The reciprocal space map of a selected sample location is generated based on intensity of pixels corresponding to the location in the sample images.

20 Claims, 7 Drawing Sheets

METHOD AND SYSTEM FOR GENERATING RECIPROCAL SPACE MAP

FIELD OF THE INVENTION

The present description relates generally to methods and systems for generating a reciprocal space map of a sample, and more particularly, to generating the reciprocal space map based on sample images acquired by irradiating the sample with a charged particle beam at multiple incident angles.

BACKGROUND OF THE INVENTION

Structure of crystalline materials may be determined based on diffraction patterns formed by irradiating a sample with a charged particle beam. When using a convergent charged particle beam for irradiating the sample, both Bragg diffraction form discrete atomic positions and Kikuchi lines formed from thermally-induced diffuse scattering combine to form the primary features in the convergent-beam electron diffraction (CBED) patterns. The location of Kikuchi lines reflects the orientation and structure of the reciprocal lattice of the sample. As such, the CBED pattern provides a mapping of the sample in the reciprocal space. When using a parallel charged particle beam for irradiating a carefully bended sample, bend contours are formed when the diffracting planes of the sample vary continuously at different angles relative to the incident beam across its surface. Similar to Kikuchi lines in the CBED, the bend contours provide a mapping of the reciprocal space. Based on the Kikuchi lines in the CBED or the bend contours, locations of crystal defects may be identified. However, a CBED pattern only probes a small volume of the sample using highly focused charged particle beam. The bend contours, on the other hand, requires careful deformation of a very thin crystalline specimen. Herein, a new method and system for generating the reciprocal space map are presented.

SUMMARY

In one embodiment, a method for imaging a sample with a charged particle microscopy system comprises irradiating the sample with a charged particle beam at multiple incident angles by tilting the charged particle beam relative to the sample around two perpendicular axes in a sample plane; forming multiple sample images, wherein each of the multiple sample image is generated responsive to irradiating the sample at one of the multiple incident angles; selecting a region of interest (ROI) of the sample; and generating a reciprocal space map of the selected ROI based on intensity of pixels corresponding to the ROI in the multiple sample images. In this way, the reciprocal space map for any location within the field of view of the imaged sample can be generated without bending the sample. The reciprocal space map contains crystallographic information of the sample.

It should be understood the summary above is provided to introduce in simplified form a selection of concepts that are further described in the detailed description. It is not meant to identify key or essential features of the claimed subject matter, the scope of which is defined uniquely by the claims that follow the detailed description. Furthermore, the claimed subject matter is not limited to implementations that solve any disadvantages noted above or in any part of this disclosure.

BRIEF DESCRIPTION OF THE DRAWINGS

Like reference numerals refer to corresponding parts throughout the several views of the drawings.

DETAILED DESCRIPTION OF EMBODIMENTS

Figure 4:
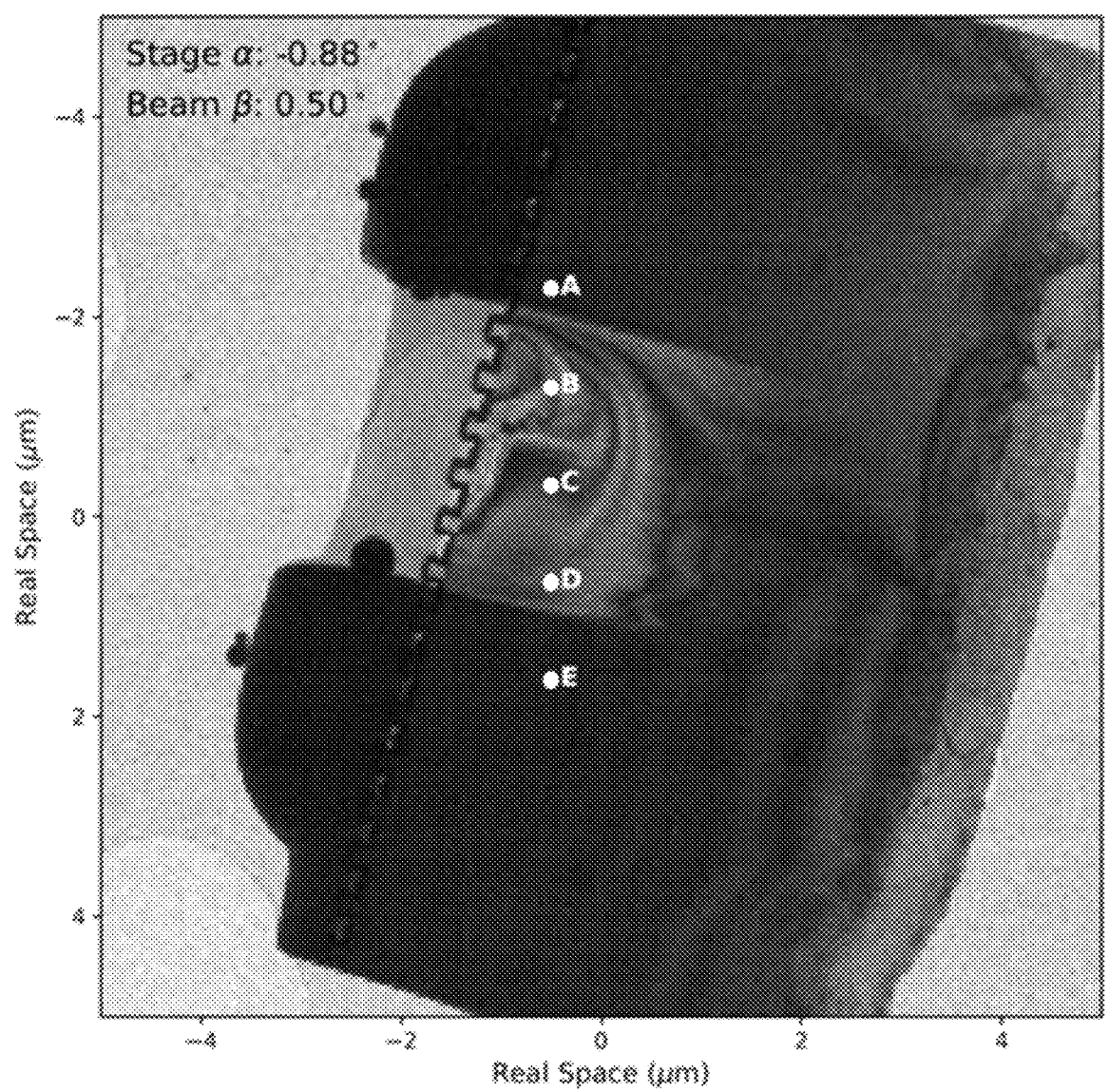
FIG. 4 is a transmission electron microscopy image of a sample acquired using the system of FIG. 1.

The following description relates to systems and methods for generating reciprocal space maps of a sample based on sample images acquired at multiple incident angles of the charged particle beam. In particular, at each of the incident angle, a sample image, such as a transmission electron microscopy (TEM) image is acquired, for example, using system shown in FIG. 1. The charged particle beam is parallel when the illumination on the sample forms a sharp Bragg diffraction pattern in the back focal plane of the objective lens, or more generally, when the zero-order beam is at a minimum cross-over in the back focal plane. As shown in FIG. 2 and FIG. 7, reciprocal space map at selected regions or locations of the sample can be reconstructed based on the sample images acquired at the multiple incident angles. The reciprocal space map shows the intensity of the sample image corresponding to the selected region at the various incident angles. As shown in FIG. 4, different locations of the sample are selected. For each location, a reciprocal space map is generated in FIGS. 5-6. Similar to the Kikuchi lines in CBED and the bent contours, the reciprocal space maps generated herein show line features, which may be used for extracting the crystallographic information, such as the structure and/or defect, of the crystalline material.

Figure 3:
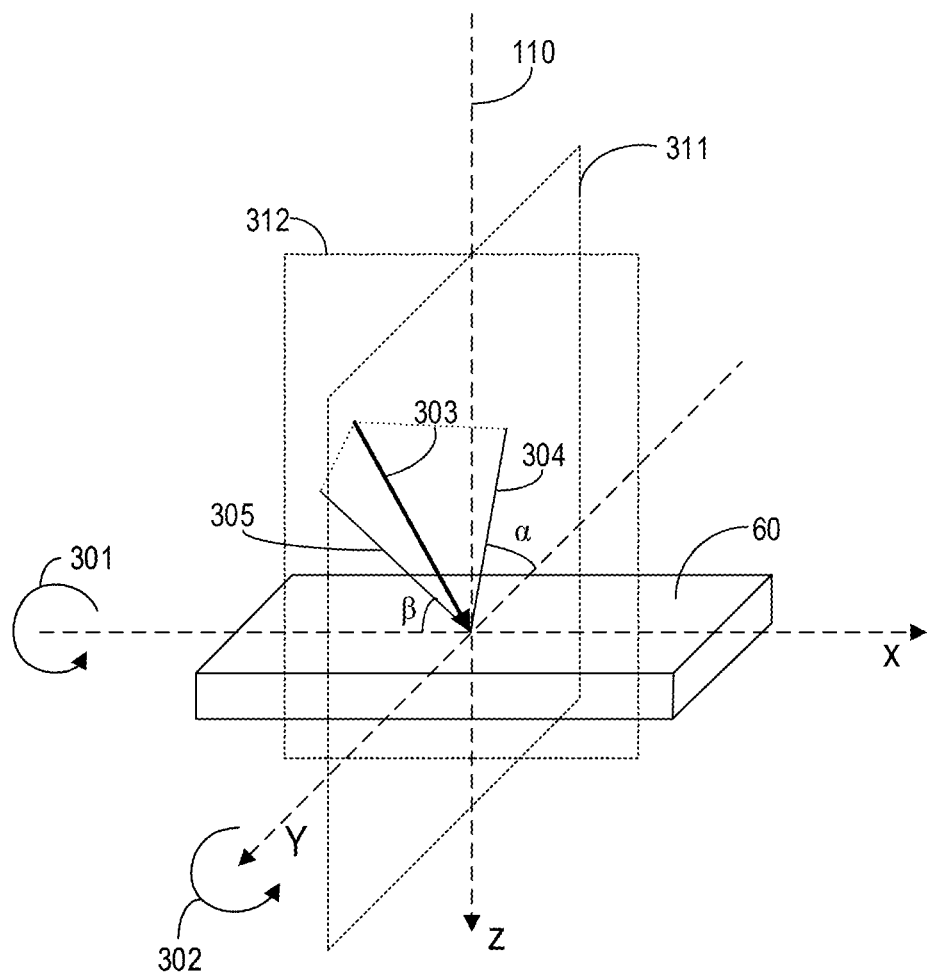
FIG. 3 illustrating relative position of an incident beam and a sample.

As shown in FIG. 3, when acquiring the multiple sample images at various incident angles, the incident angle is adjusted in two planes perpendicular to the sample plane. The sample is not deformed. The two planes may be perpendicular to each other, so that the reciprocal space is sampled according to Cartesian coordinates. In one example, the incident angle is adjusted in a first plane perpendicular to the sample plane by titling the charged particle beam around a first axis perpendicular to a primary axis of the microscope; and the incident angle is adjusted in a second plane perpendicular to the sample plane by tilting the sample around a second axis perpendicular to the primary axis of the microscope, wherein the first and second axes are perpendicular to each other and are located within the sample plane. Further, intersection of the two axes are on the sample. In another example, the incident angel is adjusted in both the first plane and the second plane by tilting the sample around the first and the second axes. By adjusting the incident angle via tilting the sample, the range of the multiple incident angles in at least one of the two planes is not limited by the tilting range of the charged particle beam.

As such, the range of at least one axis in the reciprocal space map can be large enough to show the line features.

Figure 1:
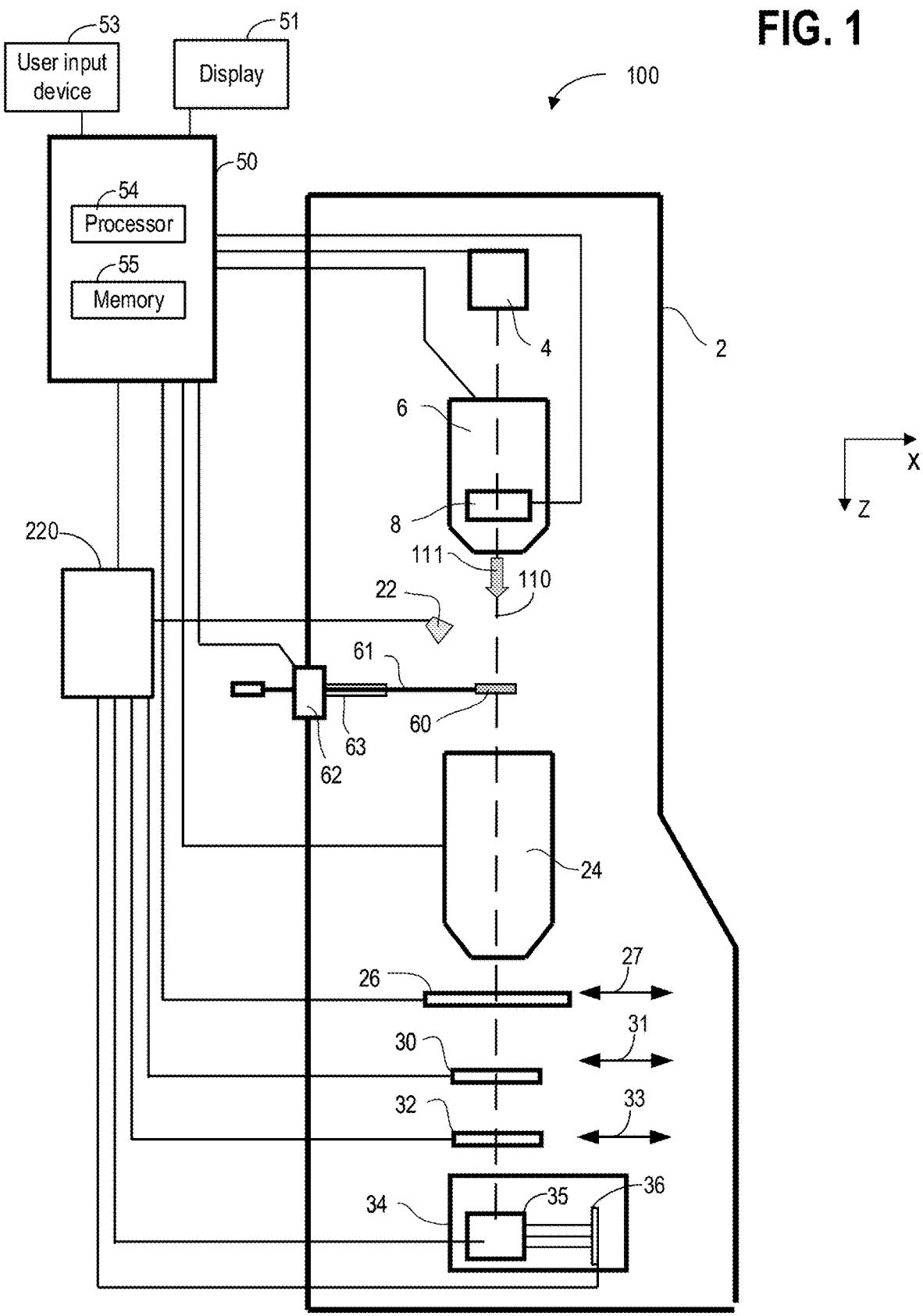
FIG. 1 shows a charged particle microscopy system, according to some embodiments.
Figure 2:
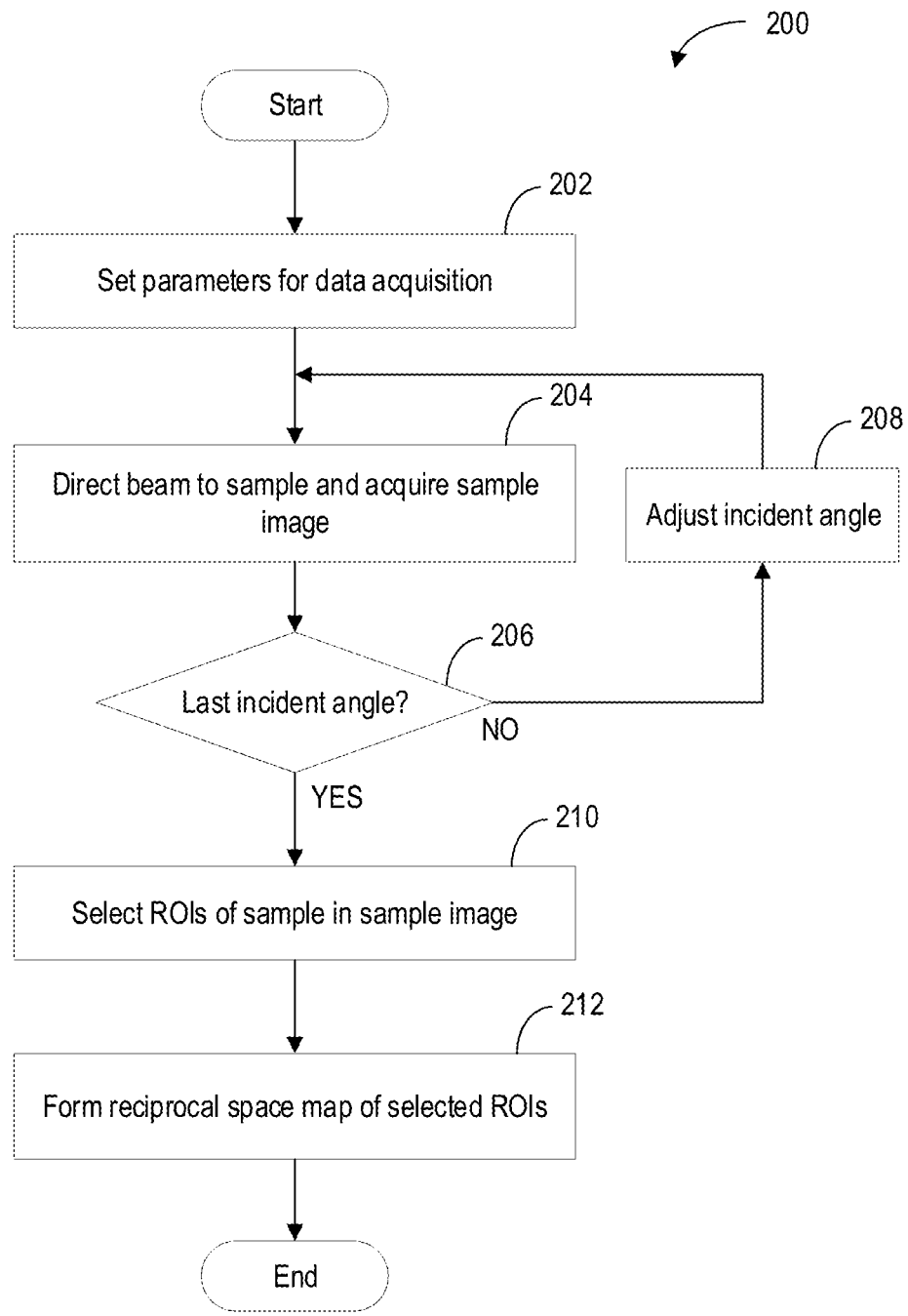
FIG. 2 shows an example method for generating a reciprocal space map.

Turning to FIG. 1, a transmission-type charged particle microscope 100, such as a TEM system is shown. The microscope includes a vacuum enclosure 2 and a charged particle source 4 for producing a charged particle beam 111 that propagates along a primary axis 110 and traverses an electron-optical illuminator 6. The electron-optical illuminator 6 serves to direct/focus the charged particles onto a chosen part of sample 60 (which may, for example, be (locally) thinned/planarized). Also depicted is a deflector 8, which can be used to tilt charged particle beam 111 relative to primary axis 110.

The sample 60 is held on a sample holder 61 that can be positioned in multiple degrees of freedom by a positioning device/stage 62, which moves a cradle 63 into which holder 61 is (removably) affixed; for example, the sample holder 61 may comprise a finger that can be moved (inter alia) in the XY plane (see the depicted Cartesian coordinate system; typically, motion parallel to Z and tilt about X/Y will also be possible). Such movement allows different parts of sample 60 to be illuminated/imaged/inspected by the electron beam 111 traveling along primary axis 110 (in the Z direction) (and/or allows scanning motion to be performed, as an alternative to beam scanning). If desired, an optional cooling device (not depicted) can be brought into intimate thermal contact with the specimen holder 61, so as to maintain it (and the sample 60 thereupon) at cryogenic temperatures, for example.

The electron beam 111 will interact with the sample 60 in such a manner as to cause various types of "stimulated" radiation to emanate from the sample 60, including (for example) secondary electrons, backscattered electrons, X-rays and optical radiation (cathodoluminescence). If desired, one or more of these radiation types can be detected with detector 22, which might be a combined scintillator/photomultiplier or EDX (Energy-Dispersive X-Ray Spectroscopy) module, for instance; in such a case, an image could be constructed using basically the same principle as in scanning electron microscopy (SEM). However, alternatively or supplementally, one can study electrons that traverse (pass through) the sample 60, exit/emanate from it and continue to propagate (substantially, though generally with some deflection/scattering) along axis 110. Such a transmitted electron flux enters projection lens 24, which will generally comprise a variety of electrostatic/magnetic lenses, deflectors, correctors (such as stigmators), etc. In normal (non-scanning) TEM mode, projection lens 24 can focus the transmitted electron flux onto detector 26, which, if desired, can be retracted/withdrawn (as schematically indicated by arrows 27) so as to get it out of the way of axis 110. An image (or diffractogram) of (part of) the sample 60 will be formed by projection lens 24 on detector (such as screen) 26, and this may be viewed through a viewing port located in a suitable part of a wall of enclosure 2. The retraction mechanism for detector 26 may, for example, be mechanical and/or electrical in nature, and is not depicted here.

As an alternative to viewing an image on detector 26, one can instead make use of the fact that the depth of focus of the electron flux leaving projection lens 24 is generally quite large (e.g. of the order of 1 meter). Consequently, various other types of analysis apparatus can be used downstream of detector 26, such as TEM camera 30, scanning transmission electron microscopy (STEM) camera 32, and spectroscopic apparatus 34.

At TEM camera 30, the electron flux can form a static image (or diffractogram) that can be processed by image processor 220 and controller 50. When not required, camera 30 can be retracted/withdrawn (as schematically indicated by arrows 31) so as to get it out of the way of axis 110.

An output from STEM camera 32 can be recorded as a function of (X, Y) scanning position of the beam 111 on the sample 60, and an image can be constructed that is a "map" of output from camera 32 as a function of X, Y. Camera 32 may comprise a matrix of pixels. When not required, camera 32 can be retracted/withdrawn (as schematically indicated by arrows 33) so as to get it out of the way of axis 110 (although such retraction would not be a necessity in the case that camera 32 is a donut-shaped annular dark field camera, for example; in such a camera, a central hole would allow flux passage when the camera was not in use).

In addition to imaging using cameras 30 and/or 32, one can also invoke spectroscopic apparatus 34, which could be an EELS module, for example. The EELS module includes a spectrometer 35 for dispersing the charged particles based on the particle energy and a detector/camera 36 for capturing the spectrum.

It should be noted that the order/location of detectors 26, 30, 32, 34 and 36 is not strict, and many possible variations are conceivable. For example, spectroscopic apparatus 34 can also be integrated into the projection lens 24.

The controller 50 is connected to various illustrated components via control lines. The controller comprises a processor 54 and non-transitory memory 55. Computer readable instructions may be stored in the non-transitory memory 55. When the instructions are executed by the controller, controller 50 provides a variety of functions, such as synchronizing actions, providing setpoints, processing signals, performing calculations, receiving operator input from user input device 53 and displaying messages/information on display device 51. Moreover, methods disclosed herein may be executed by the controller. The controller 50 may be (partially) inside or outside the enclosure 2, and may have a unitary or composite structure, as desired.

Though a transmission type electron microscope is described by way of example, it should be understood that the imaging system may be other types of charged particle microscopy system, such as through the use of reflection modes, or through the tilting of a parallel (non-convergent) scanning beam in a SEM or a focused ion beam combined with scanning electron microscopy (FIB-SEM). The charged particle may be electron, ion, or x-ray.

FIG. 2 is the flowchart of method 200 for generating the reciprocal space map using the charged particle microscopy system of FIG. 1. The reciprocal space is sampled by adjusting the incident angle of charged particle beam towards the sample. For example, by tilting the charged particle beam around two perpendicular axes in the sample plane, the reciprocal space may be sampled according to Cartesian coordinates, or any other coordinate system or allocating scan points. Intensity of each pixel in the sample image includes crystallographic information corresponding to the incident angle under which the sample image is acquired. As such, for each selected location of the imaged sample, a reciprocal space image may be generated based on the corresponding pixel intensity of the sample images acquired at multiple incident angles.

At 202, parameters for acquiring the sample images are set. The parameters may include incident angles for imaging the sample. For example, the step size and range of the incident angles may be determined. The step size determines the resolution of the reciprocal space map. The range of the incident angles determines the range of the axes of the reciprocal space map.

In one example, as shown in FIG. 3, sample 60 is positioned within sample plane XY. The sample is not deformed. The sample plane XY is perpendicular to the primary axis 110. The primary axis 110 is aligned with the Z axis. The intersection of the X and Y axes is on the sample. The incident angle is zero degrees when the beam axis of the charged particle beam is aligned with the primary axis (or Z axis). When the incident beam 303 is tilted from primary axis 110, the incident angle can be defined by tilt angle $\alpha$ within the YZ plane 311 and tilt angle $\beta$ within the XZ plane 312. Tilt angle $\alpha$ is the angle between Y axis and the projection 304 of incident beam 303 on the YZ plane 311. Tilt angle $\beta$ is the angle between X axis and the projection 305 of incident beam 303 on the XZ plane 312. As such, by rotating or tilting the incident beam and/or the sample around X axis within YZ plane 311 (as shown by 301) and around Y axis with in XZ plane 312 (as shown by 302), various incident angles may be obtained. Determining the step size and the range of the incident angles may include determining the step size and range of tilt around the X and Y axes. The incident beam may be tilted around the X or Y axis by tilting the charged particle beam or tilting the sample, respectively. The charged particle beam may be titled by adjusting the deflector within the a charged particle microscope The sample may be tilted by adjusting the sample stage. Due to the configuration of the charged particle microscope, such as the size of objective lenses in the charged particle microscope, the range of charged particle beam tilt is smaller than the sample (or stage) tilt. However, the beam tilt is faster and contributes no sample drift compared to the sample tilt. In one example, the incident angle tilt around Y axis is adjusted by beam tilt and the incident angle tilt round X axis is adjusted by sample tilt. In another example, the incident angle tilt around both X and Y axes are adjusted by sample tilt. Because the range of at least one axis of the reciprocal space map needs to be greater than 1 degree to visualize the line features, the incident beam tilt around at least one axis is achieved by sample tilt via the sample stage.

At 204, the charged particle beam is directed towards the sample at one of the incident angles determined at 202 and a sample image is acquired. The charged particle beam may be a convergent beam, and the sample image may be a TEM image generated based on transmitted charged particles acquired at the imaging plane. In some examples, the sample image may be formed based on charged particles acquired in the reflection mode, such as an SEM image. The sample image shows structures of the sample.

At 206, method 200 checks whether all incident angles determined at 202 have been imaged. If the answer is YES, method 200 moves to 210. Otherwise, the incident angle is adjusted by either adjusting the beam tilt or the sample tilt at 208. In one example, the incident angle tilt around Y axis is adjusted by beam tilt and the incident angle tilt round X axis is adjusted by sample tilt. At each sample tilt angle, the beam is tilted to multiple angles around Y axis determined at 202. In this way, the total imaging duration is reduced due to quick beam tilt, and the range in one axis of the reciprocal space map may be large due to the sample tilt. Step 206 may include realigning sample position by shifting the sample after adjusting the incident angle. The sample position is aligned when the position of the intersection between the primary axis and the sample plane on the sample is the same. In one example, the sample position may be realigned after one or more sample tilt.

At 210, one or more region of interests (ROIs) of the sample are selected. The ROIs may be selected from one of the multiple sample images. The ROI may correspond to one or more pixels in the sample image. For example, FIG. 4 shows a TEM image of sample image acquired at a sample (or stage) tilt angle of −0.88° and a beam tilt angle of 0.50°. Five ROIs (A, B, C, D and E) are selected based on the sample image. Herein each ROI corresponds to one pixel in the sample image.

At 212, a reciprocal space map is generated for each of the selected ROIs. For example, the two axes of the reciprocal space map are the beam tilt angle and the sample (or stage) tilt angle. Value of each pixel of the reciprocal space map is determined based on the intensity of one or more pixels in the sample image which correspond to the ROI. Each pixel of the reciprocal space map corresponds to the sample image acquired at a particular incident angle (or a combination of a beam tilt angle and a sample tilt angle). For example, the pixel value at pixel A of FIG. 4 is the same as the pixel value at stage tilt angle −0.88° and beam tilt angle 0.50° in the reciprocal space map 601 in FIG. 6. In other examples, the selected ROI may correspond to multiple pixels in the sample image. The pixel value of a particular pixel of the reciprocal space map of the ROI is determined based on the multiple pixels in the sample image. For example, the pixel value of the reciprocal space map may be the sum, average, or medium of the multiple pixels in the sample image.

Figure 5:
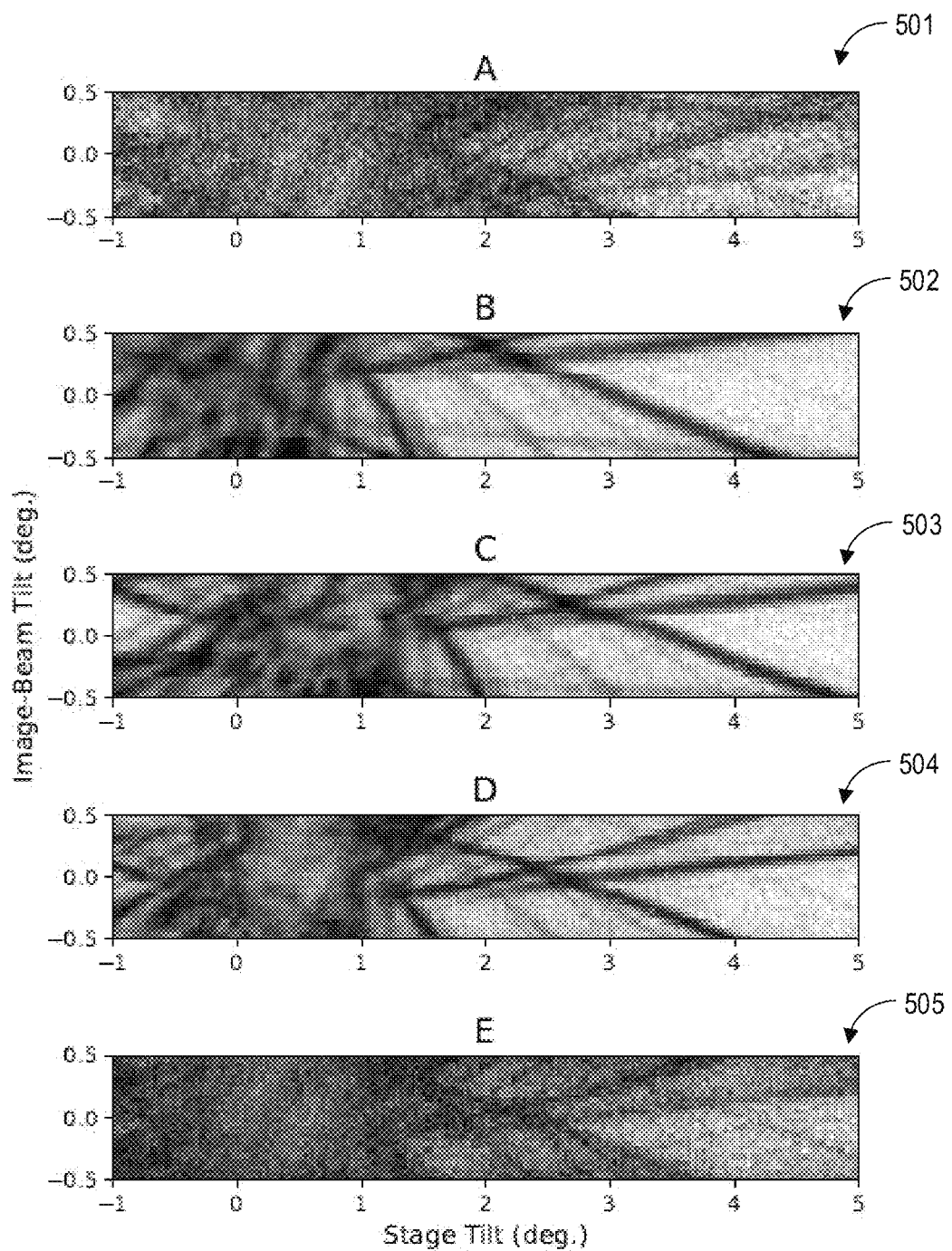
FIG. 5 shows reciprocal space maps for various locations of the sample.

FIG. 5 shows reciprocal space maps 501, 502, 503, 504 and 505 that correspond to ROIs A, B, C, D and E in the sample image of FIG. 4, respectively. For each of the reciprocal space map, the Y axis is the angle of the beam tilt, and the X axis is the angle of the sample or stage tilt. The beam tilt angle ranges from −0.5 to 0.5 degrees and the stage tilt angle ranges from −1 to 5 degrees. The stage tilt angle has a larger range than the beam tilt angle. The reciprocal space map includes lines features similar as the Kikuchi lines and the bend contours. The line features are more prominent in the reciprocal space maps when the stage tilt angle is greater than 1 degree. Because increased sample thickness at ROIs A and D comparing to ROIs B, C and D, the image contrast of reciprocal space map 501 and 505 is worse than the reciprocal space map 502, 503 and 504.

Step 212 may further include determining crystallographic information of the sample at the selected ROIs based on the reciprocal space maps. For example, crystal structure or orientation of the zone axis may be determined based on the position of the line features in the reciprocal space map. The discontinuity or twist of the line features in the reciprocal space map may indicate defect within the ROI.

In some examples, step 212 may include identifying location of the selected ROI in the sample images before forming the reciprocal space map. The location of the selected ROI in the sample images may shift and/or deform due to factors such as sample or stage drift and the change in orientation between the sample and detector. The location of the selected ROI in the sample image may be identified by comparing changes in the sample images or by feature tracking.

In this way, using a conventional TEM system, reciprocal space maps may be generated for any ROI of the sample that is within the field of view of the sample image. No sample bending is required. The reciprocal space map includes line features that may be used for determining structure, orientation, or defect of the sample. Additional sample locations can be investigated by reprocessing the multiple sample images, without acquiring additional data.

Figure 6:
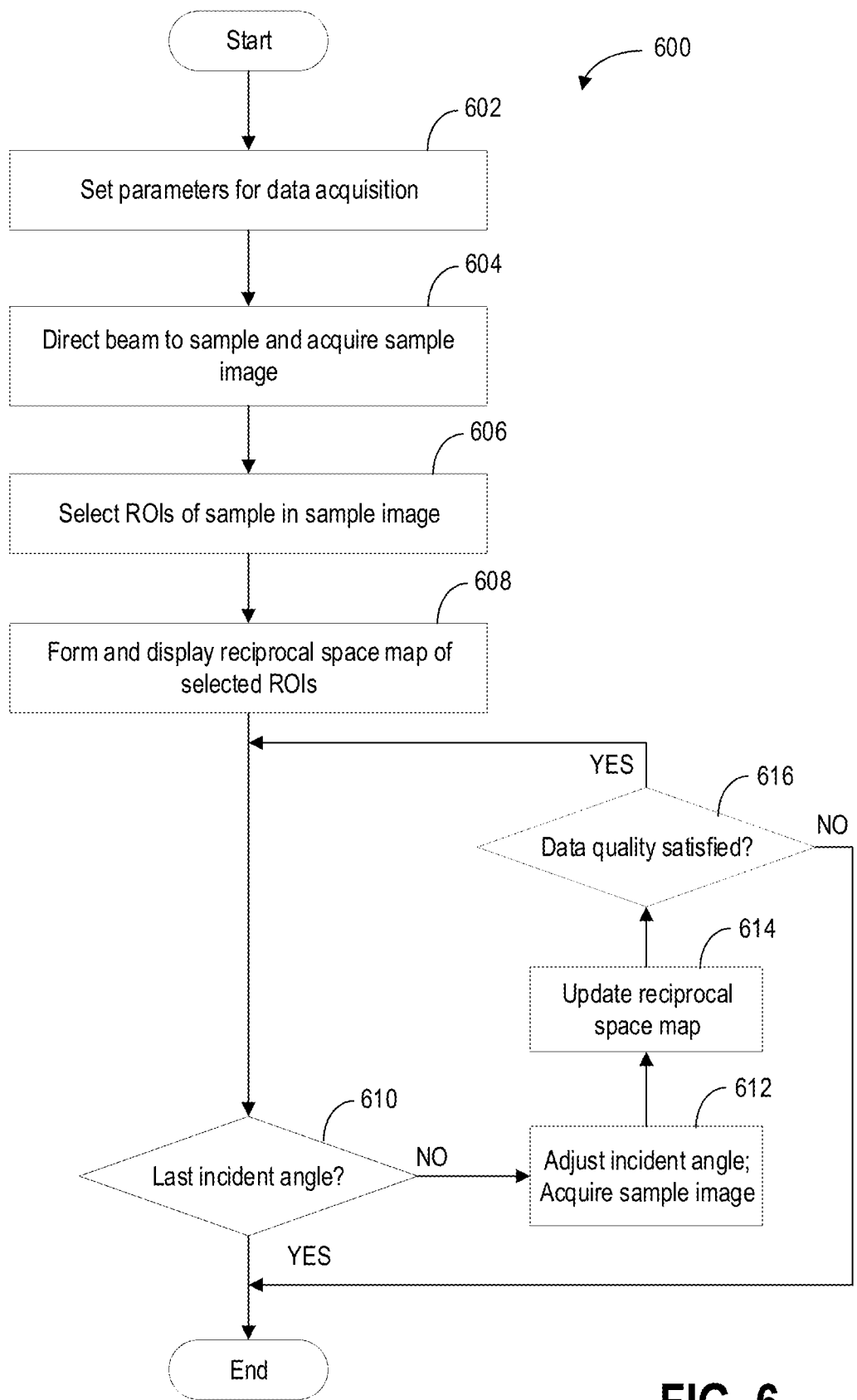
FIG. 6 shows another example method for generating the reciprocal space map.
Figure 7:
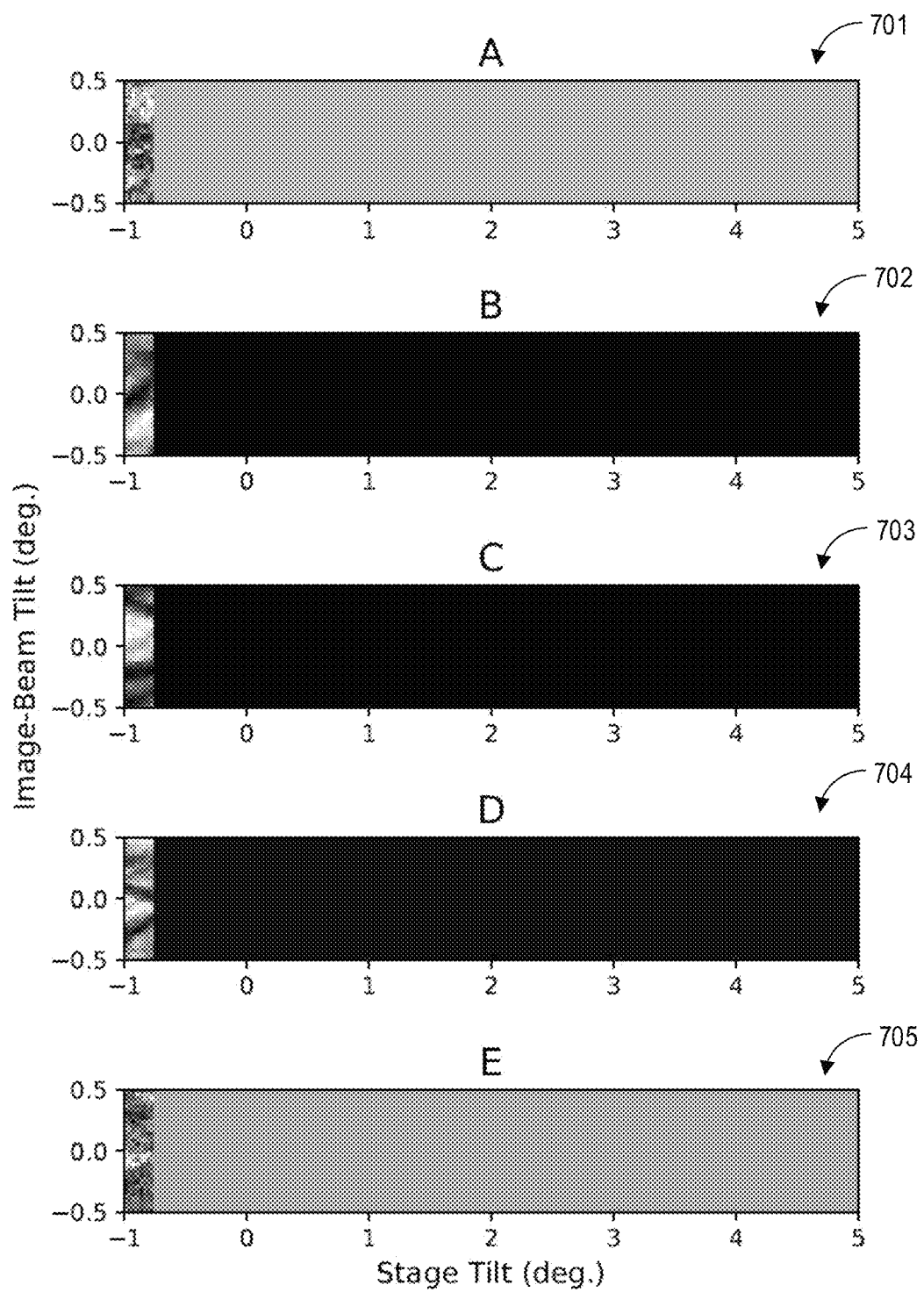
FIG. 7 shows reciprocal space maps for various locations of the sample generated while adjusting the incident angle.

FIG. 6 shows another method 600 for generating the reciprocal space map. Instead of generating the reciprocal space maps after collecting all the sample images, as shown in FIG. 2, method 600 generates the reciprocal space maps of the ROIs during the acquisition of the sample images.

At 602, similar to 202 of FIG. 2, parameters for data acquisition is set. At 604, the charged particle beam is directed to a first incident angle to acquire a first sample image. At 606, the ROIs are selected based on the first sample image. In one example, the first sample image is displayed. The operator selects the ROIs based on the displayed first sample image.

At 608, after selecting the ROIs in one of the sample images (such as the first sample image), the reciprocal space maps of the selected ROIs are generated. The reciprocal space maps may be displayed to the operator to show the progress of data acquisition.

At 610, method 600 checks whether the current incident angle is the last incident angle determined at 602. If the answer is YES, method 600 terminates. If the answer is NO, the incident angle is adjusted by adjusting one or both of the sample tilt and the beam tilt at 612. The sample image is acquired by irradiating the sample with the adjusted incident angle.

At 614, upon acquiring a sample image at the adjusted incident angle, the reciprocal space map is updated based on the recently acquired sample image at 612. Updating the reciprocal space map may include updating a pixel of the reciprocal space map which corresponds to the adjusted incident angle. The value of the updated pixel in the reciprocal space map is determined based on the sample image acquired at 612. The updated reciprocal space map may be displayed.

At 616, data quality of the reciprocal space map may optionally be assessed. Data quality may include the ability to resolve structure or defect in the sample based on the reciprocal space map. If the data quality is not good, method 600 is terminated. Otherwise, the data acquisition continues. For example, the data acquisition may be terminated when the incident beam tilt range in the reciprocal space maps is large enough for analyzing the sample structure. Data quality may also include data resolution. For example, the data acquisition may be terminated if the resolution of the reciprocal space map needs to be adjusted. The resolution of the reciprocal space map may be adjusted by the step size of beam tilt angle and/or stage tilt angle.

FIG. 7 shows the reciprocal space maps 701-705 corresponding to ROIs A-E of FIG. 4 formed during the acquisition of the sample images. For each stage tilt angle, the beam is tilted from −0.5 to 0.5 degrees. As the stage is tilted from −1 to 0 degree, the pixel values in the reciprocal space map are determined and displayed.

The technical effect of tilting the beam incident angle around two perpendicular axes in the image plane is that the reciprocal space is sampled according to the Cartesian coordinates. The technical effect of tilting the incident angle around at least one of the two perpendicular axes by tiling the sample or sample stage is that the range of the tilt angle around one axis is not limited by the optical configuration of the column. The technical effect of the forming the reciprocal space map of a selected ROI based on the sample images acquired at multiple incident angles is to generate the line features for extracting crystallographic information at the ROI.

In one embodiment, a method for imaging the sample includes irradiating a charged particle beam towards the sample at multiple incident angles by tilting the charged particle beam relative to the sample around two perpendicular axes in a sample plane; forming multiple sample images, wherein each of the multiple sample image is generated responsive to irradiating the sample at one of the multiple incident angles; selecting a region of interest (ROI) of the sample; and generating a reciprocal space map of the selected ROI based on intensity of pixels corresponding to the ROI in the multiple sample images. In a first example of the method, the charged particle beam is parallel. A second example of the method optionally includes the first example and further includes tilting the charged particle beam relative to the sample around a first axis of the two perpendicular axes by adjusting a sample stage. A third example of the method optionally includes one or more of the first to the second examples, and further includes tilting the charged particle beam relative to the sample around a second axis of the two perpendicular axes by adjusting a deflector upstream of the sample plane. A fourth example of the method optionally includes one or more of the first to the third examples, and further includes wherein a range of angles tilted around the first axis is greater than a range of angles tilted around the second axis. A fifth example of the method optionally includes one or more of the first to the fourth examples, and further includes wherein a range of angles tilted around one of the two perpendicular axes is greater than 1 degree. A sixth example of the method optionally includes one or more of the first to the fifth examples, and further includes wherein the ROI corresponds to one pixel in the sample image. A seventh example of the method optionally includes one or more of the first to the sixth examples, and further includes extracting crystallographic information of the sample from the reciprocal space map. An eighth example of the method optionally includes one or more of the first to the seventh examples, and further includes selecting multiple ROIs of the sample, and generating one reciprocal space map for each ROI based on the sample images acquired at the multiple incident angles. A ninth example of the method optionally includes one or more of the first to the eighth examples, and further includes, wherein the multiple incident angles are obtained by sampling a reciprocal space according to a coordinate system.

In one embodiment, a method for imaging the sample includes directing a parallel charged particle beam towards the sample at a first incident angle, and acquiring a first sample image based on scattered charged particles from the sample; selecting a region of interest (ROI) of the sample; generating a reciprocal space map of the selected ROI based on intensity of pixels corresponding to the ROI in the first sample image; adjusting the incident angle of the charged particle beam to a second incident angle by tilting the incident angle around one of two perpendicular axes in a sample plane; directing the charged particle beam towards the sample at the second incident angle, and acquiring a second sample image based on the scattered charged particles from the sample; and updating the reciprocal space map of the selected ROI based on intensity of pixels corresponding to the ROI in the second sample image. In a first example of the method, the sample image is a transmission electron microscopy image. A second example of the method optionally includes the first example and further includes wherein the sample image shows structures of the sample. A third example of the method optionally includes one or more of the first to the second examples, and further includes wherein the reciprocal space map representing the intensity of pixels in the sample image corresponding to the ROI at the first incident angle and the second incident angle. A fourth example of the method optionally includes one or more of the first to the third examples, and further includes wherein updating the reciprocal space map includes updating intensity of a pixel of the reciprocal space map based on intensity of pixels corresponding to the ROI in the second sample image.

In one embodiment, a charged particle microscopy system includes a source for generating a parallel charged particle beam along a primary axis; a stage for holding a sample; a controller including non-transitory memory for storing computer readable instructions, by executing the computer readable instructions, the controller is configured to: irradiate the parallel charged particle beam towards the sample at multiple incident angles by tilting the charged particle beam relative to the sample around two axes in a sample plane, where the two axes are perpendicular to each other, and the sample plane is perpendicular to the primary axis; form multiple sample images, wherein each of the multiple sample image is generated responsive to irradiating the sample at one of the multiple incident angles; select a region of interest (ROI) of the sample; and generate a reciprocal space map of the selected ROI based on intensity of pixels corresponding to the ROI in the multiple sample images. In a first example of the system, the system further includes wherein the charged particle microscopy system further includes a deflector for tilting the charged particle beam around the sample around a first axis of the two axes, and the charged particle beam is tilted around a second axis of the two axes by the sample stage. A second example of the system optionally includes the first example and further includes wherein the charged particle beam is tilted relative to the sample around each of the two axes by adjusting the sample stage. A fourth example of the method optionally includes one or more of the first to the third examples, and further includes wherein a range of the multiple incident angles tilted around at least one axis of the two orthogonal axes is greater than one degree. A fifth example of the method optionally includes one or more of the first to the fourth examples, and further includes, wherein the controller is further configured to extract crystallographic information of the sample from the reciprocal space map.

What is claimed is:

1. A method for imaging a sample with a charged particle microscopy system, comprising:
   irradiating a charged particle beam towards the sample at multiple incident angles by tilting the charged particle beam relative to the sample around two perpendicular axes in a sample plane;
   forming multiple sample images, wherein each of the multiple sample image is generated responsive to irradiating the sample at one of the multiple incident angles;
   selecting a region of interest (ROI) of the sample; and
   generating a reciprocal space map for mapping a reciprocal space of the selected ROI based on intensity of pixels corresponding to the ROI in the multiple sample images.

2. The method of claim 1, wherein the charged particle beam is parallel.

3. The method of claim 1, further comprising tilting the charged particle beam relative to the sample around a first axis of the two perpendicular axes by adjusting a sample stage.

4. The method of claim 3, further comprising tilting the charged particle beam relative to the sample around a second axis of the two perpendicular axes by adjusting a deflector upstream of the sample plane.

5. The method of claim 4, wherein a range of angles tilted around the first axis is greater than a range of angles tilted around the second axis.

6. The method of claim 1, wherein a range of angles tilted around one of the two perpendicular axes is greater than 1 degree.

7. The method of claim 1, wherein the ROI corresponds to one pixel in the sample image.

8. The method of claim 1, further comprising extracting crystallographic information of the sample from the reciprocal space map.

9. The method of claim 1, further comprising selecting multiple ROIs of the sample, and generating one reciprocal space map for each ROI based on the sample images acquired at the multiple incident angles.

10. The method of claim 1, wherein the multiple incident angles are obtained by sampling a reciprocal space according to a coordinate system.

11. A method for imaging a sample with a charged particle microscopy system, comprising:
    directing a parallel charged particle beam towards the sample at a first incident angle, and acquiring a first sample image based on scattered charged particles from the sample;
    selecting a region of interest (ROI) of the sample;
    generating a reciprocal space map for mapping a reciprocal space a of the selected ROI based on intensity of pixels corresponding to the ROI in the first sample image;
    adjusting the incident angle of the charged particle beam to a second incident angle by tilting the incident angle around one of two perpendicular axes in a sample plane;
    directing the charged particle beam towards the sample at the second incident angle, and acquiring a second sample image based on the scattered charged particles from the sample; and
    updating the reciprocal space map of the selected ROI based on intensity of pixels corresponding to the ROI in the second sample image.

12. The method of claim 11, wherein the sample image is a transmission electron microscopy image.

13. The method of claim 11, wherein the sample image shows structures of the sample.

14. The method of claim 11, wherein the reciprocal space map representing the intensity of pixels in the sample image corresponding to the ROI at the first incident angle and the second incident angle.

15. The method of claim 11, wherein updating the reciprocal space map includes updating intensity of a pixel of the reciprocal space map based on intensity of pixels corresponding to the ROI in the second sample image.

16. A charged particle microscopy system, comprising:
    a source for generating a parallel charged particle beam along a primary axis;
    a stage for holding a sample;
    a controller including non-transitory memory for storing computer readable instructions, by executing the computer readable instructions, the controller is configured to:
    irradiate the parallel charged particle beam towards the sample at multiple incident angles by tilting the charged particle beam relative to the sample around two axes in a sample plane, where the two axes are perpendicular to each other, and the sample plane is perpendicular to the primary axis;

form multiple sample images, wherein each of the multiple sample image is generated responsive to irradiating the sample at one of the multiple incident angles;

select a region of interest (ROI) of the sample; and generate a reciprocal space map for mapping a reciprocal space of the selected ROI based on intensity of pixels corresponding to the ROI in the multiple sample images.

17. The charged particle microscopy system of claim 16, wherein the charged particle microscopy system further includes a deflector for tilting the charged particle beam around the sample around a first axis of the two axes, and the charged particle beam is tilted around a second axis of the two axes by the sample stage.

18. The charged particle microscopy system of claim 16, wherein the charged particle beam is tilted relative to the sample around each of the two axes by adjusting the sample stage.

19. The charged particle microscopy system of claim 16, wherein a range of the multiple incident angles tilted around at least one axis of the two orthogonal axes is greater than one degree.

20. The charged particle microscopy system of claim 16, wherein the controller is further configured to extract crystallographic information of the sample from the reciprocal space map.

* * * * *